United States Patent [19]

Lin

[11] Patent Number: 5,151,620
[45] Date of Patent: Sep. 29, 1992

[54] CMOS INPUT BUFFER WITH LOW POWER CONSUMPTION

[75] Inventor: Ming-Zen Lin, Hsinchu, Taiwan

[73] Assignee: Industrial Technology Research Institute, Chutung, Taiwan

[21] Appl. No.: 674,209

[22] Filed: Mar. 25, 1991

[51] Int. Cl.$^5$ .............................................. H03K 17/16
[52] U.S. Cl. .................................. 307/475; 307/443; 307/246; 307/451
[58] Field of Search ............... 307/475, 451, 443, 270, 307/279, 594, 597, 272.3, 450, 246

[56] References Cited

U.S. PATENT DOCUMENTS

| | | | |
|---|---|---|---|
| 4,258,272 | 3/1981 | Huang | 307/475 |
| 4,437,024 | 3/1984 | Wacyk | 307/475 |
| 4,818,901 | 4/1989 | Young et al. | 307/451 |
| 4,825,106 | 4/1989 | Tipon et al. | 307/451 |
| 4,929,853 | 5/1990 | Kim et al. | 307/451 X |
| 4,973,861 | 11/1990 | Dikken | 307/451 X |
| 5,034,623 | 7/1991 | McAdams | 307/475 X |

*Primary Examiner*—David Hudspeth
*Attorney, Agent, or Firm*—George O. Saile

[57] ABSTRACT

A buffer circuit for connecting a CMOS logic circuit to receive TTL logic level signals assures that the upper and lower FET's of an otherwise conventional input inverter stage do not both turn on together in the situation in which an input signal has a level that is high enough to turn on the lower FET but not high enough to turn off the upper FET. A third and a fourth FET are connected to form a controlled power supply stage that controls the current supplied to the upper FET. The third FET has its gate connected to be controlled from the output of a second inverter stage (which is in phase with the input to the first stage). When the TTL input rises, the second inverter stage output turns off the third FET and thereby turns off the upper FET. The fourth FET is connected as a capacitor that is charged while the third FET is turned on and then supplies current to switch the output inverter stage when the upper FET is turned on. A fifth FET is connected to charge the capacitor and a circuit is provided to detect when power is initially supplied to the buffer circuit and to turn on the fifth FET momentarily to initially charge the capacitor.

11 Claims, 3 Drawing Sheets

CMOS INPUT BUFFER WITH LOW POWER CONSUMPTION

BACKGROUND

1. FIELD OF THE INVENTION

This invention relates to semiconductor circuits and more specifically to a buffer circuit for interconnecting a CMOS logic and a TTL circuit logic.

2. INTRODUCTION

In CMOS circuits there is a familiar problem of connecting CMOS logic circuits to operate with binary logic signals from TTL logic circuits. From a more general standpoint, there is a problem in connecting a CMOS circuit to operate with signals in a different voltage range. In CMOS circuits of the type that will be described, a down level representing (arbitrarily) a logical 0, is commonly in the range of 0 to 0.3 volts and an up level is in the range of 4.7 to 5 volts. The corresponding TTL logic levels are typically 0 to 0.8 volts and 2.4 to 6.5 volts. These specific voltage ranges will help to explain the circuit of this invention, but the problem that has been described can exist occur with other voltage ranges and the specific circuit that will be described later will be useful in a variety of applications.

Circuits that make this voltage change are commonly called TTL input buffer circuits. The buffer circuit of this invention uses a feature of many TTL input buffers: it has an input inverter stage that receives the TTL level signals and an output inverter stage that provides signals at CMOS voltage levels for associated CMOS circuits.

These inverter circuits are well known, but it will be helpful to review the features and terminology that particularly apply to this invention. They have two FET's that are each connected to conduct between opposite ones of the power supply terminals and a common output node. It will be convenient to call one of these FET's the upper FET and the other one the lower FET according to their usual location in a circuit diagram. The two FET's are complementary (one has an n-channel and the other has a p-channel) and they switch oppositely in response to an input signal at the common connection of their gate terminals. When the input signal is up, the lower FET turns on and the upper FET turns off; when the input is down the lower FET turns off and the upper FET turns on.

When an inverter of this type is used as an input buffer for TTL signals, the up level from the TTL circuits may be high enough to turn on the lower FET but not high enough to turn off the upper FET. If both FET's are on together, they dissipate an undesirably high level of power.

3. THE PRIOR ART

*IEEE Journal of Solid-State Circuits,* Vol. 25, No. 2, Apr. 1990, pages 525-530, on page 526 discusses the problem of interconnecting TTL circuits and CMOS circuits. FIG. 4 on page 527 shows a buffer circuit with two inverter stages. An FET Q10 is connected between the source of the upper FET, Q9, of the input stage and the corresponding power supply point. The gate of Q10 is connected to a reference potential point established by the circuit in the dashed line box to the left and it limits the current in the input inverter stage.

SUMMARY OF THE INVENTION

The buffer circuit of this invention has an input inverter stage and an output inverter stage, both with pairs of complementary FET's. and an object of the invention is to prevent both FET's of the input stage from turning on together, except momentarily as part of a normal switching operation. The upper FET in the input stage has its source terminal connected to a controlled power supply node. A controlled power supply circuit is connected to control the power at this node. When the TTL input rises to turn off the upper FET, the controlled power supply limits the current in the drain-collector circuit of the upper FET and thereby prevents both the upper and lower FET's from conduction together and also helps to turn off the upper FET. When the TTL input falls to turn on the upper FET, the controlled power supply provides power for charging the capacitance of the line that connects the output of the input stage to the gate terminals of the output stage and thereby switches the output stage.

The preferred controlled power supply has a p-channel FET that is connected to conduct between power supply terminal $V_{DD}$ and the controlled power supply node. The gate terminal of this FET is connected to the output line of the output inverter stage, and this FET switches on and off in phase with the upper FET of the input inverter stage. Thus, when the TTL input rises to turn off the upper FET of the input inverter stage, the FET of the controlled power supply circuit also turns off. From a more general standpoint, this FET has the same channel type as the upper FET of the input inverter stage and is connected to produce a signal of like phase.

A capacitor is connected between the controlled power supply node and circuit ground. When the FET of the controlled power supply is turned on, it charges this capacitor. While the FET of the controlled power supply circuit is turning on in response to a down level input signal, the capacitor discharges to provide current for switching the output inverter stage of the buffer circuit.

THE DRAWING

THE PREFERRED EMBODIMENT

The Circuit — Conventional Features

Figure 1:
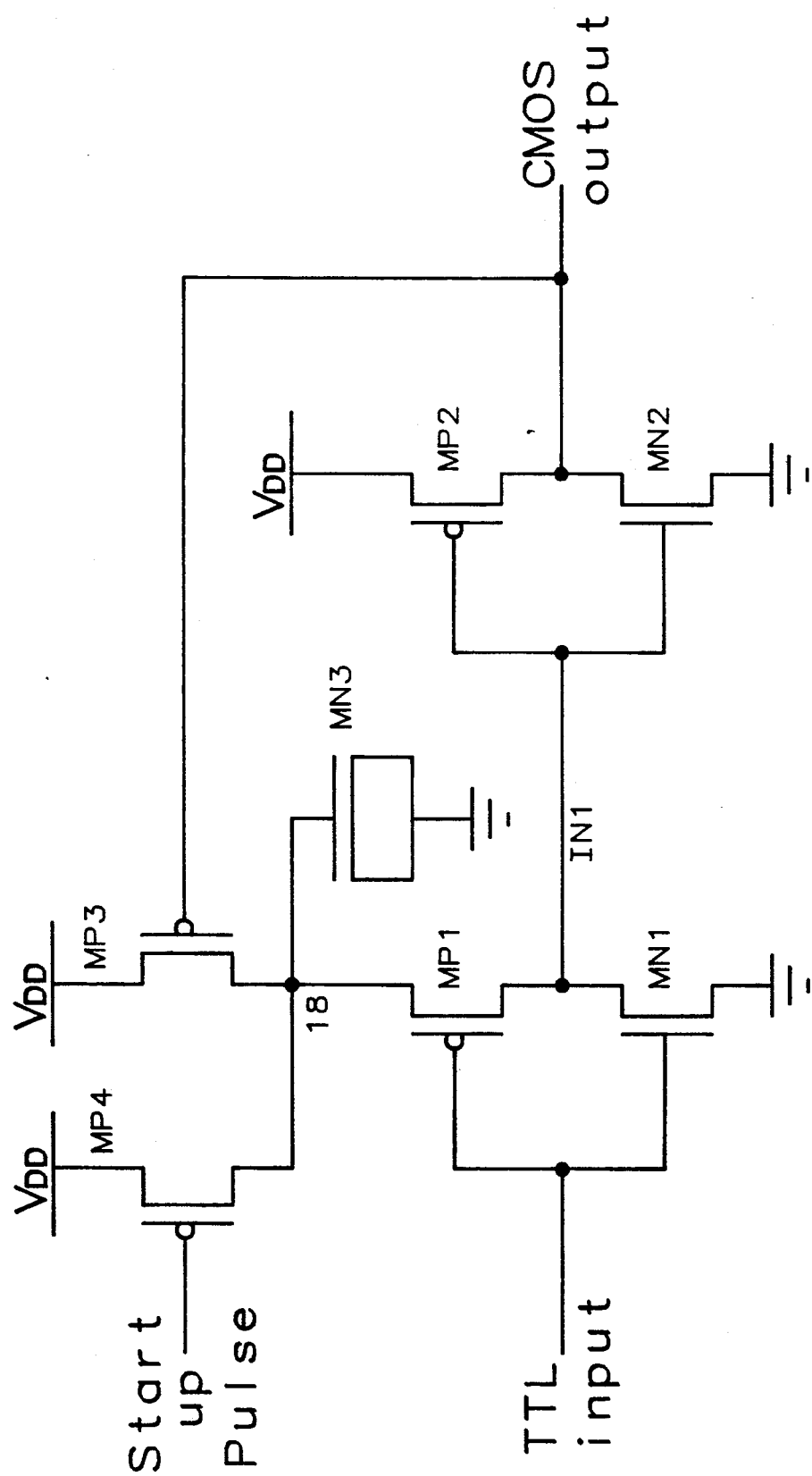
FIG. 1 is a schematic diagram of the buffer circuit of this invention.

FET'S MM1 and MP1 are connected to form an input inverter stage. Their gate terminals have a common connection to the line TTL Input to receive binary signals in the TTL voltage range. Their drain terminals have a common connection to form the output of this stage. FET MN1 is an n-channel device and turns on when its gate is made suitably positive (an up level signal in the circuit of the drawing) with respect to its source. FET MP1 is a p-channel device and turns on when its gate is given a suitable down level. The circuit of FET's MN1 and MP1 is conventional except for the connection of the source terminal of MP1 to the controlled power supply node 18 which will be described later.

FET's MN2 and MP2 are conventionally connected to form the output inverter stage. A line IN1 connects the output connection of MN1, MP1 to the gates of MN2, MP2. Note that the signal on line CMOS Output is in phase with the signal on line TTL Input, and more specifically that it is in phase with the signal applied to the gate of MP1.

The Controlled Power Supply Circuit

The controlled power supply circuit includes FET's MP3 and MN3. MP3 has its source terminal connected to a power supply terminal, $V_{DD}$, and its drain terminal connected to the controlled power supply node 18. The gate of MP3 is connected to the line CMOS Output. MP3 is a p-channel device and it turns on when its gate is given a suitable down level and turns off when its gate is given a suitable up level. Note that MP3 turns on and off in phase with MP1.

FET MN3 is connected to form a capacitor at the controlled power supply node 18. Its gate terminal is connected to the controlled power supply node and its drain and source terminals are connected to ground.

Recall that one object of the invention is to prevent both MP1 and MN1 from conducting at the same time, as may occur when the input on line TTL Input is up sufficiently to turn MN1 on but not sufficiently to turn MP1 off. As will be explained in more detail later, an up level on line TTL Input produces an up level on line CMOS Output turn off FET MP3, and this off state of MP3 lets the interstage IN1 line fall to turn on MP2 and turn off MN2.

Operation with TTL Input at an Up Level

Figure 2A:
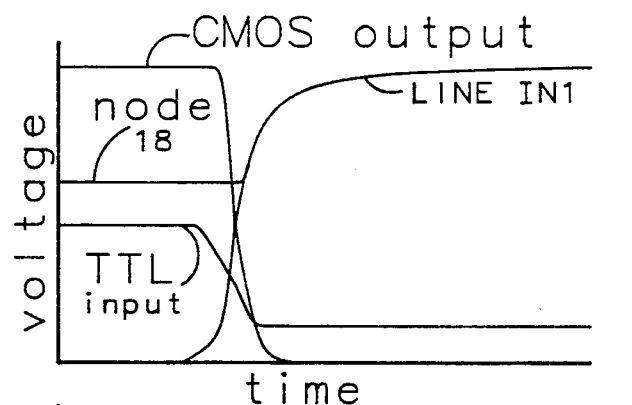
FIG. 2A shows several voltage waveforms illustrating the circuit operation in response to the fall of the input signal.
Figure 2B:
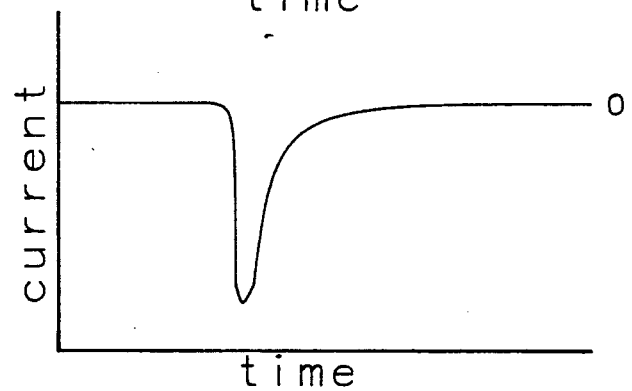
FIG. 2B is a current waveform at terminal $V_{DD}$ for the switching operation of FIG. 2A.
Figure 2C:
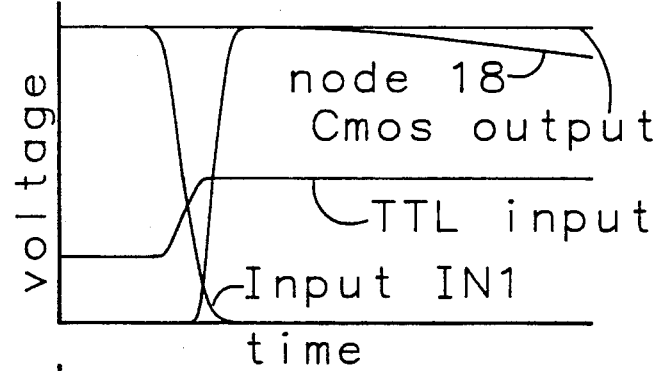
FIG. 2C shows several voltage waveforms illustrating the circuit operation in response to the rise of the input signal.
Figure 2D:
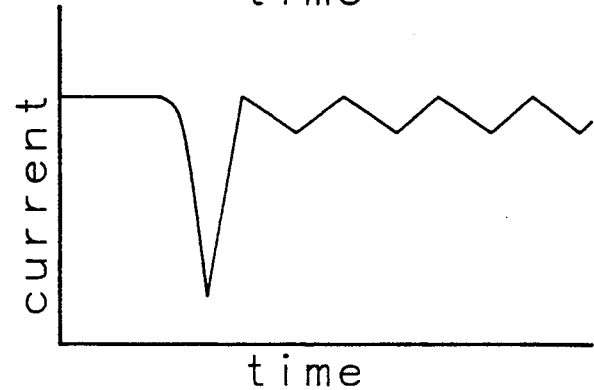
FIG. 2D is a current waveform at terminal $V_{DD}$ for the switching operation of FIG. 2C.

This operating condition is shown in FIGS. 2A and 2B to the left of the transitions and in FIGS. 2C and 2D to the right of the transitions. At the beginning of this example, the up level on line TTL Input turns on FET MN1 and turns off FET MP1. The interstage line IN1 has a down level which turns on MP2 and turns off MN2. The line CMOS Output, which has the same phase as the line TTL Input, has an up level in the CMOS range. This is the normal operation of two interconnected inverter stages. Note that the signal on line CMOS output is higher than the signal o line TTL Input.

The up level of the line CMOS Output turns off MP3, and the voltage at node 18 has an intermediate value which will be explained later. Note that the starting point for the current waveform in FIG. 2B is zero current on the vertical axis.

The Transition from High to Low on line TTL Input

See FIGS. 2A and 2B. When the signal on line TTL Input falls, its down voltage level is suitable to turn off MN! and turn on MP1, substantially as in the operation of a conventional inverter stage. As this input falls, MN1 begins to turn off and MP1 begins to turn on. At this point in the description of this operation, MN2 and MP2 in the output inverter stage have not switched and consequently the line CMOS Output is still up. Consequently, MP3 is still off, and it isolates node 18 from power supply point $V_{DD}$, as already described. The capacitor formed by MN3 begins discharging through the drain-collector circuit of FET MP1 and thereby pulls up the interstage line IN1 and turns MN2 on and MP2 off. The on state of MN2 then pulls down the CMOS output line and turns on MP3.

Note that the voltage at node 18 rises a capacitor MN3 is charged when MF3 is turned on. As FIG. 2B shows, current from power supply terminal $V_{DD}$ flows during the switching transition and it then decreases as capacitor MN3 is charged.

Operation with line TTL Input at a Down Level

This operating condition is shown in FIGS. 2A and 2B to the right of the transitions and in FIGS. 2C and 2D to the left of the transitions. In the input inverter stage, MP1 is on and MN1 is off and in the output inverter stage MN2 is on and MP2 is on, as will be understood from the operation of conventional FET inverter circuits. The on state of MN2 turns on MP3, and MP3 keeps capacitor MN3 charged to a high voltage.

The Transition from Low to High on Line TTL Input

At the beginning of the switching operation shown in FIGS. 2C and 2D, MN1 is off and MP1 and MP3 are on, as already described. When the signal on line TTL Input rises from low to TTL high, MN1 turns on, but it may occur that this signal is not high enough to turn off MP1. The on state of MN1 pulls down the interstage line IN1 and thereby turns MN2 off and MP2 on, as in the operation of two conventional inverter stages. The voltage on line CMOS Output rises, and this voltage turns off MP3. The off state of MP3 permits the voltage at the controlled power supply node 18 to begin dropping, as shown in FIG. 2C while FET MP1 is still on. When node 18 has discharged to the level on line TTL Input (2.4 volts for example) plus a threshold for FET MP1, MP1 turns off and prevents the node from discharging further. This final voltage for node 18 is shown in FIG. 2A to the left of the transitions.

The Start-Up Circuit

Before power is first applied to the associated circuit device, the drain, source and gate terminals of each of the FET's are down, as is true of other FET circuits. As the circuit has been described so far (without the circuit of FET MP4) the interstage line IN1 would stay down until MP1 and MP3 are both turned on (as in the normal operations described already). However, the down level of line IN1 turns on MP2 and thereby pulls up the line CMOS output and provides a voltage to keep MP3 turned off. Thus the topology that has been described so far presents a problem in establishing the appropriate initial state for the circuit. Means is provided for initially charging the controlled power supply node capacitor MN3 to the appropriate voltage for normal circuit operation. A semiconductor device may have several of these buffer circuits, but it needs only one detector circuit. Accordingly, the added space and power for the start up circuit is small.

The preferred start-up circuit can be explained as having two parts: (1) an FET MP4 which is connected to conduct in parallel with MP3 between the power supply terminal $V_{DD}$ and the controlled power supply node and (2) a start-up pulse generator for detecting when power is first applied to the associated semiconductor device and for supplying a pulse to turn on MP4 momentarily and then turning off MP4 after MP4 has charged capacitor MN3 in the same way that MN3 is otherwise charged when MN3 is turned on. MP4 is kept turned off during the normal operation of the buffer circuit.

Figure 3:
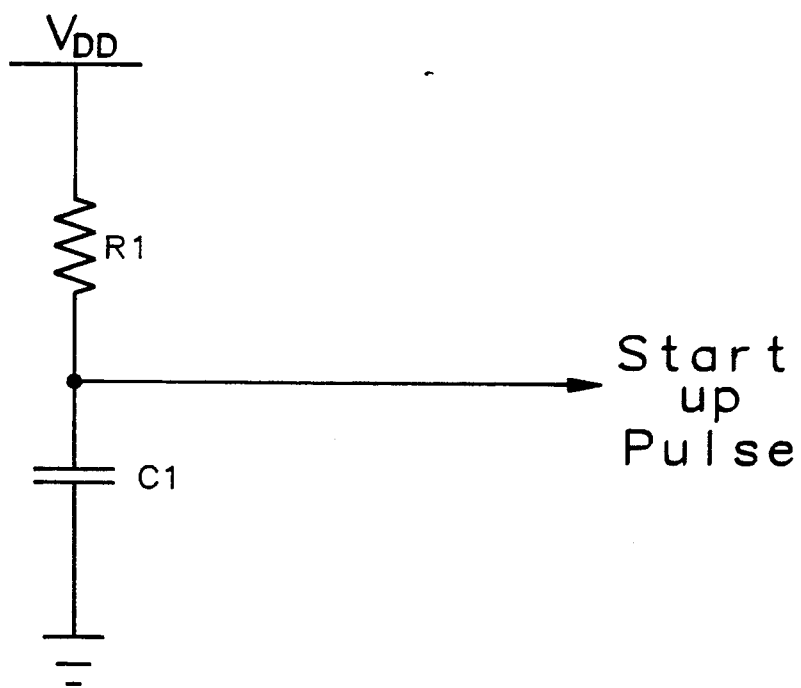
FIG. 3 is a schematic drawing of a start up pulse generator.

FIG. 3 shows a circuit for detecting when the power is first applied to the associated chip may comprise a resistor-capacitor (R-C) network with one terminal of the resistor connected to $V_{DD}$ and one terminal of the capacitor connected to ground. The circuit is well known. The start-up pulse appears at the common connection point of the resistor and capacitor. When power is applied to the chip, the voltage at the common connection point is initially at ground (the charging current causes the voltage VD to appear across the resistor), and the start-up pulse has an appropriate voltage to turn on MP4. As the capacitor charges to $V_{DD}$, the start-up pulse becomes sufficiently positive to turn off MP4. The R-C circuit has a time constant that is longer than the rise time of the power supply voltage at terminal $V_{DD}$. (The voltage on the capacitor does not rise to a level to turn off MP4 until after $V_{DD}$ has been up long enough to charge capacitor MN3.) From a more general standpoint, this start-up circuit has a timing circuit for producing the start-up pulse during an appropriately short interval after power is first turned on.

In another example of a start-up circuit, the rising voltage $V_{DD}$ provides the timing but an amplifier shapes this signal to provide the start-up pulse low for a long enough time to permit capacitor MN3 to charge through MP4. In one form this circuit comprises (1) a voltage divider that is connected between $V_{DD}$ and ground to provide a rising signal and (2) two inverters that shape the signal and provide the same phase at the gate of MP4 as in the description of the R-C circuit.

A third example of a detector circuit combines a capacitor for timing and a pulse shaping amplifier.

Other Embodiments

Those skilled in the art will understand that this buffer circuit can be implemented in FET's of opposite conductivity type and can be modified for use with circuits of different power supply voltages and different signal voltages. Other modifications will be apparent, within the intended scope of the claims.

I claim:

1. In an integrated circuit device having a CMOS buffer circuit of the type having an input inverter stage having two FET's designated the "upper" FET (MP1) and the "lower" FET (MN1) and an output inverter stage (MN2, MP2) connected to provide a signal in a CMOS range in response to a binary input signal in a different range, an improvement for preventing both input stage FET's from conducting when the input signal is high enough to turn on the lower FET (downMN1) but not high enough to turn off the upper FET (MP1), comprising:

a controlled power supply stage connected between a node (18) to which the source terminal of the upper FET (MN1) is connected and the corresponding power supply terminal ($V_{DD}$) of the device, means connecting the controlled power supply stage to receive a controlling signal from the output inverter stage, a capacitor (MN3) connected between the controlled power supply node and a different potential point (ground), means in the controlled power supply stage responsive to the controlling signal to supply current for charging the capacitor when the output of the stage is at a low logic level and for interrupting the current to the node when the output of the output stage is at a high logic level, whereby the capacitor supplies current to switch the output inverter stage when the input signal falls to a low logic level and whereby the controlled power supply stage is turned off to prevent current flow in both the upper FET and the lower FET when the input signal rises to a high logic level, and means for initially charging the capacitor when power is first applied to the circuit power supply terminals.

2. The CMOS buffer of claim 1 wherein the means in the controlled power supply stage comprises an FET (MP3) of the same conductivity type as the upper FET (MP1) of the input inverter stage.

3. The CMOS buffer of claim 2 wherein the FET in the controlled power supply (MP3) has its source terminal connected to a power supply terminal of the device ($V_{DD}$) and its drain connected to the controlled power supply node.

4. The CMOS buffer of claim 3 wherein the power supply stage FET is connected to turn on and off in phase with the upper FET of the input stage inverter.

5. The CMOS buffer of claim 4 wherein the capacitor is formed by a fourth FET (MN3) having its gate terminal connected to the controlled power supply node.

6. The CMOS buffer of claim 5 wherein the means for initially charging the capacitor comprises a fifth FET (MP4) connected to conduct between said corresponding power supply terminal and said controlled power supply node and means for supplying a pulse to turn on the fifth FET momentarily when power is applied to the power supply terminals of the device.

7. The CMOS buffer of claim 6 wherein the means for turning on the Fifth FET includes a timing circuit connected across the power supply terminals for producing a voltage pulse to turn on the fifth FET until the timing circuit has reached a predetermined value and then to turn off the fifth FET.

8. The CMOS buffer of claim 7 wherein the timing circuit comprises a capacitor and a resistor each having one end connected to the gate of said fifth FET, the other end of the capacitor connected to ground, and the other end of the resistor connected to said corresponding power supply terminal, whereby the fifth FET is turned on momentarily when power is applied to the power supply terminals of the device and is turned off as the capacitor voltage approaches the voltage of said corresponding power supply terminal.

9. The CMOS buffer of claim 6 wherein the means for turning on the fifth FET comprises means connected to respond to the rise of the voltage at the power supply terminals and to turn on the fifth FET during a beginning part of the rise and to turn off the fifth FET at a later part of the rise that is sufficient for charging the capacitor.

10. The CMOS buffer of claim 9 wherein the means for turning on the fifth FET includes an amplifier for shaping the rise of the start-up signal.

11. A circuit device having a plurality of the CMOS buffer circuits defined in claim 6, each including said fifth FET for initially charging the capacitor, and a single one of said means for supplying a pulse as defined in claim 6, and means connecting each of said fifth FET's to be turned on by said single one of said means for supplying a pulse.

* * * * *

UNITED STATES PATENT AND TRADEMARK OFFICE
CERTIFICATE OF CORRECTION

PATENT NO. : 5,151,620
APPLICATION NO. : 07/674209
DATED : September 29, 1992
INVENTOR(S) : Lin It is certified that error appears in the above-identified patent and that said Letters Patent is hereby corrected as shown below:

Title page item (54) and col. 1, line 1, "CMOS input buffer with low power consumption" should read as follows: -- TTL to CMOS input buffer for reducing power consumption --.

Signed and Sealed this

Twenty-second Day of September, 2009

David J. Kappos
*Director of the United States Patent and Trademark Office*